US011546990B2

(12) United States Patent
Tuominen (10) Patent No.: US 11,546,990 B2
(45) Date of Patent: Jan. 3, 2023

(54) COMPONENT CARRIER WITH BRIDGE STRUCTURE IN THROUGH HOLE FULFILLING MINIMUM DISTANCE DESIGN RULE

(71) Applicant: AT&S Austria Technologie & Systemtechnik Aktiengesellschaft, Leoben (AT)

(72) Inventor: Mikael Tuominen, Pernio (FI)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/751,024

(22) Filed: Jan. 23, 2020

(65) Prior Publication Data
US 2020/0253050 A1 Aug. 6, 2020

(30) Foreign Application Priority Data
Jan. 31, 2019 (CN) .......................... 201910100374.3

(51) Int. Cl.
*H05K 1/00* (2006.01)
*H05K 1/02* (2006.01)
(Continued)

(52) U.S. Cl.
CPC ........... *H05K 1/115* (2013.01); *H05K 1/0213* (2013.01); *H05K 1/09* (2013.01); *H05K 3/4038* (2013.01)

(58) Field of Classification Search
CPC .. H05K 1/00; H05K 1/02; H05K 1/03; H05K 1/11; H05K 1/14; H05K 1/16;
(Continued)

(56) References Cited

U.S. PATENT DOCUMENTS 8,891,245 B2 * 11/2014 Furutani ........... H01L 23/49822
361/763
9,392,705 B2 * 7/2016 Sunohara .......... H01L 23/49827
(Continued)

FOREIGN PATENT DOCUMENTS

| CN | 102740614 A | 10/2012 |
| JP | 2006324526 A | 11/2006 |
| JP | 2018163986 A | 10/2018 |

OTHER PUBLICATIONS

Wilk, F.; Office Action issued in Application No. 10 2020 102 362.6; German Patent and Trademark Office; pp. 1-10; Sep. 2, 2020; 80297, Munich, Germany.
(Continued)

*Primary Examiner* — Xiaoliang Chen
(74) *Attorney, Agent, or Firm* — Robert A. Blaha; Smith Tempel Blaha LLC (57) ABSTRACT

A component carrier with an electrically insulating layer structure has opposed main surfaces, a through-hole, and an electrically conductive bridge structure connecting opposing sidewalls delimiting the through-hole. The sidewalls have a first tapering portion extending from a first main surface and a second tapering portion extending from a second main surface. A first demarcation surface faces the first main surface and a second demarcation surface faces the second main surface. A central bridge plane extends parallel to the first main surface and the second main surface and is at a vertical center between a lowermost point of the first demarcation surface and an uppermost point of the second demarcation surface. A first intersection point is between the central bridge plane and one of the sidewalls delimiting the through hole. A length of a shortest distance from the first intersection point to the first demarcation surface is at least 8 μm.

19 Claims, 4 Drawing Sheets

(51) Int. Cl.
*H05K 1/03* (2006.01)
*H05K 1/11* (2006.01)
*H05K 1/14* (2006.01)
*H05K 1/16* (2006.01)
*H05K 3/00* (2006.01)
*H05K 3/10* (2006.01)
*H05K 3/42* (2006.01)
*H05K 3/46* (2006.01)
*H05K 3/40* (2006.01)
*H05K 1/09* (2006.01)

(58) Field of Classification Search
CPC . H05K 1/115; H05K 3/00; H05K 3/10; H05K 3/42; H05K 3/46
USPC .............. 174/262, 255, 258, 260, 264, 266; 361/748, 803; 29/829, 852
See application file for complete search history.

(56) References Cited

U.S. PATENT DOCUMENTS

| | | | | |
|---|---|---|---|---|
| 9,693,466 B2* | 6/2017 | Harao | | H05K 3/325 |
| 10,304,620 B2* | 5/2019 | Lee | | H01F 27/324 |
| 2001/0023138 A1* | 9/2001 | Mori | | H05K 7/1069 |
| | | | | 439/53 |
| 2006/0021794 A1* | 2/2006 | Cheng | | H05K 3/0032 |
| | | | | 174/264 |
| 2009/0308651 A1* | 12/2009 | Abe | | H05K 3/445 |
| | | | | 174/264 |
| 2010/0147575 A1* | 6/2010 | Lee | | H05K 1/119 |
| | | | | 174/262 |
| 2010/0163297 A1* | 7/2010 | Kajihara | | H05K 3/427 |
| | | | | 174/264 |
| 2010/0307807 A1* | 12/2010 | Noda | | H05K 3/0038 |
| | | | | 174/264 |
| 2010/0307809 A1* | 12/2010 | Noda | | H05K 3/4602 |
| | | | | 174/266 |
| 2011/0120762 A1* | 5/2011 | Kawai | | H05K 3/423 |
| | | | | 174/264 |
| 2012/0043123 A1* | 2/2012 | Takada | | H05K 3/4602 |
| | | | | 174/258 |
| 2012/0168220 A1* | 7/2012 | Lee | | H05K 3/429 |
| | | | | 174/264 |
| 2012/0199386 A1* | 8/2012 | Adachi | | H01L 23/142 |
| | | | | 174/258 |
| 2012/0229990 A1* | 9/2012 | Adachi | | H05K 3/4608 |
| | | | | 361/748 |
| 2012/0246924 A1* | 10/2012 | Hibino | | H01L 23/49827 |
| | | | | 29/829 |
| 2012/0246925 A1* | 10/2012 | Hibino | | H05K 3/0038 |
| | | | | 29/830 |
| 2013/0081866 A1* | 4/2013 | Furutani | | H01L 23/49822 |
| | | | | 174/260 |
| 2013/0081870 A1* | 4/2013 | Furutani | | H05K 3/445 |
| | | | | 174/262 |
| 2013/0192883 A1* | 8/2013 | Furutani | | H05K 1/185 |
| | | | | 174/258 |
| 2014/0097013 A1* | 4/2014 | Hara | | H05K 1/115 |
| | | | | 174/266 |
| 2014/0216794 A1* | 8/2014 | Hibino | | H05K 3/0032 |
| | | | | 174/255 |
| 2014/0338965 A1* | 11/2014 | Kajihara | | H05K 3/426 |
| | | | | 174/266 |
| 2015/0351240 A1* | 12/2015 | Nabeyama | | H05K 3/429 |
| | | | | 361/760 |
| 2015/0366061 A1* | 12/2015 | Noda | | H05K 3/4697 |
| | | | | 361/803 |
| 2015/0366062 A1* | 12/2015 | Noda | | H01L 23/49827 |
| | | | | 361/803 |
| 2016/0330836 A1 | 11/2016 | Mizutani et al. | | |
| 2017/0354034 A1* | 12/2017 | Hitsuoka | | H05K 3/423 |
| 2018/0212550 A1* | 7/2018 | Imazeki | | H05K 1/115 |

OTHER PUBLICATIONS

Office Action in China Patent Application No. 201910100374.3, pp. 1-11; dated Sep. 29, 2022; China National Intellectual Property Administration; No. 6, Xitucheng Lu, Jimenqiao Haidian District, 100088; Beijing City; China.

English translation of cover page of Office Action in China Patent Application No. 201910100374.3, pp. 1-3; dated Sep. 29, 2022; China National Intellectual Property Administration; No. 6, Xitucheng Lu, Jimenqiao Haidian District, 100088; Beijing City; China.

* cited by examiner

COMPONENT CARRIER WITH BRIDGE STRUCTURE IN THROUGH HOLE FULFILLING MINIMUM DISTANCE DESIGN RULE

CROSS-REFERENCE TO RELATED APPLICATION

This application claims priority to Chinese Patent Application No. 201910100374.3 filed Jan. 31, 2019, the disclosure of which is hereby incorporated herein by reference.

TECHNICAL FIELD

Embodiments of the invention relate to a component carrier and a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

In particular, it may be advantageous to efficiently contact electrically conductive layer structures and/or components mounted on and/or embedded in a component carrier with proper quality. Formation of mechanical vias and laser vias, which may be copper filled, may be advantageous for this and other purposes.

SUMMARY

There may be a need to manufacture a component carrier with proper electric reliability.

According to an exemplary embodiment of the invention, a component carrier is provided which comprises an electrically insulating layer structure having a first main surface and a second main surface, a through hole (in particular a laser through hole) extending through the electrically insulating layer structure between the first main surface and the second main surface, and an electrically conductive bridge structure connecting opposing sidewalls delimiting the through hole (in particular, the sidewalls define a border between the electrically insulating layer structure and the through hole), wherein the through hole has a first tapering portion extending from the first main surface and a second tapering portion extending from the second main surface, wherein the electrically conductive bridge structure is delimited by a first demarcation surface facing towards the first main surface and by a second demarcation surface facing towards the second main surface, wherein a central bridge plane is defined to extend parallel to the first main surface and the second main surface and at (or through or including) a vertical center between a lowermost point of the first demarcation surface and an uppermost point of the second demarcation surface, wherein a first intersection point is defined as a first intersection between the central bridge plane and one of the sidewalls delimiting the through hole, and wherein a length of a shortest distance (in particular a length of a first perpendicular) from the first intersection point to the first demarcation surface is at least 8 µm.

According to another exemplary embodiment of the invention, a method of manufacturing a component carrier is provided, wherein the method comprises forming a through hole (in particular a laser through hole) extending between a first main surface and a second main surface of an electrically insulating layer structure, wherein the through hole is formed with a first tapering portion extending from the first main surface and a second tapering portion extending from the second main surface, forming an electrically conductive bridge structure connecting opposing sidewalls delimiting the through hole, wherein the electrically conductive bridge structure is formed to be delimited by a first demarcation surface facing towards the first main surface and by a second demarcation surface facing towards the second main surface, wherein a central bridge plane is defined to extend parallel to the first main surface and the second main surface and at a vertical center between a lowermost point of the first demarcation surface and an uppermost point of the second demarcation surface, wherein a first intersection point is defined as a first intersection between the central bridge plane and one of the sidewalls delimiting the through hole, and wherein the electrically conductive bridge structure is formed so that a length of a shortest distance, in particular a length of a first perpendicular, from the first intersection point to the first demarcation surface is at least 8 µm.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "through hole" may particularly denote a hole extending completely through an entire electrically insulating layer structure, and which may be formed in particular and preferably by laser processing. Thus, the through hole may be a laser through hole. Such a through hole may have, for example, two opposing tapering portions extending from the two opposing main surfaces of the electrically insulating layer structure. A through hole may be manufactured for instance by a combination of laser shots from the front side and the back side, i.e. from the two opposing main surfaces of, the electrically insulating layer structure. One or more laser shots may be performed from each of these sides. Formation of a through hole by laser processing from only one main surface may be possible as well. Furthermore, formation of a through hole may be carried out as well by other methods than laser processing, for instance by a plasma treatment.

In the context of the present application, the term "bridge structure" may particularly denote an electrically conductive structure extending substantially horizontally between opposing sidewalls of the electrically insulating layer structure and delimiting the through hole, in particular at or close to a narrowest portion of the through hole. For instance, such a bridge structure can be formed by plating following through hole formation. After such a plating procedure, the previously formed through hole is only partially filled with electrically conductive material constituting the bridge structure, so that the bridge structure is delimited in an upward direction by a first demarcation surface and at a lower side by a second demarcation surface. Both the first demarcation surface and the second demarcation surface may have a concave shape.

In the context of the present application, the term "central bridge plane" may particularly denote a virtual plane with a horizontal extension, i.e. parallel to the two opposing main surfaces of the electrically insulating layer structure, and extending at a height level in the middle between a lowermost point of the first demarcation surface and an uppermost point of the second demarcation surface. In the context of the present application, the central bridge plane is considered for defining a minimum distance rule according to an exemplary embodiment of the invention.

In the context of the present application, the term "intersection point" is introduced as a virtual point used for formulating the minimum distance design rule according to an exemplary embodiment of the invention. The respective intersection point is defined as a virtual intersection between the beforementioned central bridge plane and one of the sidewalls of the electrically insulating layer structure delimiting the through hole in a cross-sectional view.

In the context of the present application, the term "a perpendicular" may particularly denote a straight line extending from a respective intersection point up to a respective demarcation surface and intersecting this demarcation surface so that a right angle is formed between the straight line and a tangent (in particular a tangent plane) on the curved demarcation surface at a position of an intersection between the straight line and the demarcation surface. In other words and descriptively speaking, the perpendicular may correspond to a shortest connection line between the intersection point and the demarcation surface, and may intersect the latter at a right angle.

According an exemplary embodiment of the invention, a manufacturing method for manufacturing a component carrier with through hole (in particular laser through hole) being filled with electrically conductive material is provided, wherein the electric reliability of the filled through hole is highly advantageous. It has been surprisingly found that when fulfilling a specific design rule for the bridge structure filling part of the through hole of a component carrier, the electric and mechanical reliability of the obtained component carrier is high. This means that undesired phenomena such as cracks in the electrically conductive filling medium filling the through hole and/or voids remaining in an interior of the through hole filled with electrically conductive material can be reliably prevented or at least strongly suppressed when meeting this design rule. More specifically, the mentioned design rule relates to the fact that a shortest distance between a sidewall of the through hole at the vertical level of a central plane of the bridge structure and a respective demarcation surface delimiting the bridge structure should be at least 8 μm. Although it is preferable that this design rule is fulfilled for both or all intersection points between the sidewalls and the central plane on the one hand and both demarcation surfaces on the other hand, good results have already been achieved when fulfilling this design rule already for one intersection point and one demarcation surface.

According to an exemplary embodiment of the invention, a through hole in an electrically insulating layer structure filled partially or entirely with electrically conductive material can be provided which results in a high reliability of a correspondingly manufactured component carrier. Such a component carrier may comply even with tight reliability requirements in view of the described formation of the metal filling layer of the laser via. More specifically, by controlling bridge plating for forming an electrically conductive filling structure (in particular a copper structure with substantially horizontal extension in the through hole), a significantly increased reliability performance can be obtained. Descriptively speaking, by controlling the bridge plating thickness on the corner of the through hole, the reliability performance can be improved. While conventionally a failure may already occur after 10-20 times reflow with middle glass transition temperature/middle coefficient of thermal expansion materials, a failure occurred only after more than 30 times reflow with middle glass transition temperature/middle coefficient of thermal expansion materials according to exemplary embodiments of the invention. Experiments have shown that such an improved reliability can be obtained by controlling the minimum distance from the via wall and bridge center intersection to the surface of the bridge plating layer with a control limit of at least 8 μm. Thus, a robust and reliable through hole core process can be obtained. Such a process is properly compatible with a modified semi-additive processing (mSAP) process flow.

In the following, further exemplary embodiments of the component carrier and the method will be explained.

In an embodiment, the length of the shortest distance, in particular of the first perpendicular, from the first intersection point to the first demarcation surface is at least 15 μm. Particularly appropriate results in terms of electrical, mechanical and thermal reliability have been achieved when the mentioned shortest distance has a minimum length of 15 μm.

In an embodiment, the length of the shortest distance, in particular of the first perpendicular, from the first intersection point to the first demarcation surface is in a range between 20 μm and 40 μm, in particular between 20 μm and 30 μm. It has turned out to provide the best results when the length of the first perpendicular has been selected within the mentioned ranges. If the length of the shortest distance becomes too small, reliability issues may occur. If the shortest distance becomes too large, it may become more difficult to completely fill the entire through hole, if desired, and/or to obtain a void free bridge structure with homogeneous properties.

In an embodiment, a length of a shortest distance, in particular of a second perpendicular, from the first intersection point to the second demarcation surface is at least 8 μm, in particular at least 15 μm, more particularly in a range between 20 μm and 40 μm, preferably between 20 μm and 30 μm. Thus, in order to further improve reliability of the component carrier, it has turned out advantageously that also the opposing second intersection meets the above-described design rules in terms of minimum distance.

In an embodiment, a second intersection point is defined as a second intersection between the central bridge plane and one of the sidewalls of the electrically insulating layer structure delimiting the through hole, wherein a length of a shortest distance, in particular of a third perpendicular, from the second intersection point to the first demarcation surface is at least 8 µm, in particular at least 15 µm, more particularly in a range between 20 µm and 40 µm, preferably between 20 µm and 30 µm. Thus, the second intersection point may be defined correspondingly to the definition of the first intersection point, as described herein. The reliability of the component carrier and in particular of the electrically conductively filled through hole can be further improved when the above-mentioned design rules concerning the first and/or second perpendicular/shortest distance are also fulfilled for the third perpendicular/shortest distance corresponding to the second intersection point defined in a cross-sectional view of the component carrier.

In an embodiment, a length of a shortest distance, in particular of a fourth perpendicular, from the second intersection point to the second demarcation surface is at least 8 µm, in particular at least 15 µm, more particularly in a range between 20 µm and 40 µm, preferably between 20 µm and 30 µm. If the described design rules are also met by the fourth perpendicular or shortest distance, reliability issues can be rendered even more unlikely.

In an embodiment, a circumferential intersection line is defined by connecting all intersection points corresponding to an intersection between the central bridge plane and circumferential sidewalls of the electrically insulating layer structure, wherein a length of all shortest distances, in particular of all perpendiculars, from the circumferential intersection line to the first demarcation surface is at least 8 µm, in particular at least 15 µm, more particularly in a range between 20 µm and 40 µm, preferably between 20 µm and 30 µm. According to such a highly preferred embodiment, the mentioned design rule is fulfilled along the entire circumference of the through hole in relation to the first demarcation surface. Descriptively speaking, the central bridge plane intersects the three-dimensional sidewall surface delimiting the through hole along a planar annular intersection line. According to the mentioned embodiment, the above-described design rule concerning minimum distance is fulfilled for each individual point on this circumferential intersection line in relation to the first demarcation surface. This may ensure that no circumferential weak point occurs in terms of reliability in the through hole filled with electrically conductive material.

In an embodiment, a length of all shortest distances, in particular of all perpendiculars, from the circumferential intersection line to the second demarcation surface is at least 8 µm, in particular at least 15 µm, more particularly in a range between 20 µm and 40 µm, preferably between 20 µm and 30 µm. Still referring to the previously described embodiment, the mentioned design rule may hence also be fulfilled for the entire circumferential intersection line in relation to the second demarcation surface. This corresponds to the most preferable embodiment in terms of reliability.

In an embodiment, a thickness of the electrically insulating layer structure is less than 100 µm, in particular less than 60 µm, more particular in the range between 30 µm and 60 µm. In particular with relatively thin electrically insulating layer structures, i.e. having a thickness of 100 µm or less, reliability issues concerning the electrically conductive filling of through holes becomes more and more an issue. However, when the above described minimum distance design rule is expected, it has turned out that even for such thin cores, a proper reliability of a component carrier may be obtained.

In an embodiment, the electrically insulating layer structure is a core. Such a core may be substantially fully cured, i.e. may comprise resin which is substantially no more able to cross-link but is already highly or completely cross-linked. C-stage resin may or may not be 100% crosslinked polymer chains, but may at least have a network of highly crosslinked polymer chains, so that the final product cannot be thermally reformed and is insoluble. As a consequence, such a material will not re-melt or become flowable again during a subsequent lamination procedure in which one or more electrically conductive layer structures and/or electrically insulating layer structures may be laminated on the top surface and/or the bottom surface of the core with copper filled through hole(s). For instance, such a core may be made of FR4 material, i.e. resin including reinforcing particles such as glass fibers or glass spheres.

In an embodiment, the bridge structure also covers at least part of the sidewalls of the electrically insulating layer structure delimiting the through hole. During the manufacturing process, it may be possible to firstly cover the sidewalls of the through hole with a thin seed layer of electrically conductive material, preferably copper. Subsequently, the bridge structure may be formed by a plating procedure, for instance by galvanic plating. During such a plating procedure, the sidewalls may be covered with a thicker layer of electrically conductive material, followed by the formation of a connection between the sidewalls with plating material, in many cases at or close to a narrowest portion of the through hole. Thus, a substantially H-shaped bridge structure with a horizontal bridge part may be obtained.

Thus, the bridge structure may be composed of a seed layer being covered with a plating layer. Correspondingly, forming the electrically conductive bridge structure may be carried out by plating, in particular following a seed layer formation. The seed layer, preferably made of copper, may be formed for instance by electroless deposition. After having formed such a seed layer covering the sidewalls with a thin layer (for instance having a thickness in the range between 0.1 µm and 1 µm, for instance 0.5 µm) of electrically conductive material such as copper, a substantial amount of electrically conductive material (preferably copper) may be formed on this seed layer preferably by plating or galvanic deposition (for instance with a thickness in the range between 5 µm and 30 µm). This procedure of filling the through hole with electrically conductive material has turned out as particularly efficient.

In an embodiment, the component carrier comprises a first electrically conductive bulk structure filling at least part of a volume between the first demarcation surface and the first main surface, i.e. filling at least part of a dimple above the first demarcation surface. In an embodiment, the component carrier comprises a second electrically conductive bulk structure filling at least part between the second demarcation surface and the second main surface, i.e. filling at least part of a dimple below the second demarcation surface. Correspondingly, the method may comprise forming a first electrically conductive bulk structure filling at least part between the first demarcation surface and the first main surface and/or a second electrically conductive bulk structure filling at least part between the second demarcation surface and the second main surface. After having completed a plating procedure of forming the bridge structure, remaining empty spaces within the through hole above the first demarcation surface and/or below the second demarcation surface may be filled partially or entirely with further electrically conductive material such as copper. This filling is denoted as first and second electrically conductive bulk structure. Preferably, such electrically conductive bulk structures may be formed in plating procedures being separate from a plating procedure of forming the bridge structure. As known by those skilled in the art of component carrier manufacture, a transition between the bridge structure and the bulk structures can be seen in a cross-sectional view of a manufactured component carrier. Thus, the bridge structure on the one hand and the bulk structures on the other hand can be visually separated in a cross-sectional view of the component carrier.

In an embodiment, at least one of the first electrically conductive bulk structure and the second electrically conductive bulk structure is a plating structure. Correspondingly, the method may comprise forming at least one of the group consisting of the first electrically conductive bulk structure and the second electrically conductive bulk structure by a further plating procedure following a previous plating procedure of forming the bridge structure. It is also possible to manufacture a respective one of the bulk structures with a sequence of multiple subsequent plating structures. In a cross-sectional view of the component carrier, the individual plating layers forming together the respective bulk structure are visually inspectable and can be visually separated.

In an embodiment, the component carrier comprises a (for instance patterned) first electrically conductive layer structure (in particular a first metal foil having a first window aligned with the first tapering portion of the through hole extending through the electrically insulating layer structure) on the first main surface and/or a (for instance patterned) second electrically conductive layer structure (in particular a second metal foil having a second window aligned with the second tapering portion of the through hole extending through the electrically insulating layer structure) on the second main surface. Thus, a respective electrically conductive layer may be attached to each of two opposing main surfaces of the electrically insulating layer structure. Preferably, the electrically conductive layer structures may be copper foils. By a first laser shot from the first main surface of the electrically insulating layer structure, a first window may be formed in the first electrically conductive layer structure. Correspondingly, a second window may be formed in the second electrically conductive layer structure by a second laser shot from the second main surface of the electrically insulating layer structure.

In another embodiment, the method comprises forming the through hole in the electrically insulating layer structure while one or both of the main surfaces of the electrically insulating layer structure is or are not covered by an electrically conductive layer structure. In such an embodiment (in which electrically conductive layer structures on one or both of the opposing main surfaces of the electrically insulating layer structure may be dispensable), the through hole may be drilled directly through the electrically insulating layer structure alone.

In an embodiment, at least a part of the through hole is substantially X-shaped. A through hole having such a shape may be formed by carrying out a first laser drilling from the first main surface with only one laser shot and carrying out a second laser drilling from the second main surface with only one further laser shot. Thus, a substantial X-shape may be the finger-print of a manufacturing procedure of forming the through hole using a single laser shot from the front side and a single laser shot from the back side.

In another embodiment, at least a part of the through hole has a central (for instance substantially cylindrical) section between two opposing tapering sections. A through hole having such a shape may be formed by carrying out a first laser drilling from the first main surface with (for instance only) one laser shot and carrying out a second laser drilling from the second main surface with (in particular exactly) two laser shots. A correspondingly formed through hole may comprise a central connection portion connecting the first tapering portion with the second tapering portion, wherein the bridge structure may be at least partially located in the central connection portion. Thus, the shape of the through hole may have a for instance straight or substantially straight central connection portion between two opposing tapering portions at the upper and lower end of the through hole. The bridge structure may then be formed in this central connection portion. Such a geometry may be obtained by combining a single laser shot from the first upper main surface with two subsequent laser shots from the second main surface.

In an embodiment, a narrowest vertical thickness of the bridge structure is at least 20 μm. It has been surprisingly found that when the narrowest vertical thickness of the bridge structure connecting opposing sidewalls of the electrically insulating layer structure delimiting the through hole is 20 μm or more, no reliability issues occur any more, even when forming the through hole in a thin electrically insulating layer structure with a thickness of not more than 200 μm. Thus, the mentioned design rule significantly improves the reliability of copper filed laser vias in thin cores.

In an embodiment, a narrowest horizontal width of the through hole is not less than 30 μm, in particular not less than 45 μm. It has been surprisingly found that also the minimum horizontal width of the through hole is an important design parameter for obtaining proper reliability of a component carrier having a through hole being at least partially filled with electrically conductive filling medium. Furthermore, in particular for thin cores with a thickness of not more than 200 μm, keeping the narrowest part of the through hole (and therefore a narrowest width of the bridge structure being present in this narrowest portion of the through hole) at or above 30 μm, preferably at or above 45 μm, may have a further positive impact on the reliability. A complete filling of even this narrowest portion of the through hole can then be guaranteed. This has a positive impact on both electrical as well mechanical reliability of the manufactured component carrier. When the mentioned design rules are respected, a risk of cracks may be significantly suppressed.

In an embodiment, a narrowest horizontal width of the through hole is not more than 100 μm, in particular not more than 75 μm. It has also been found that the narrowest horizontal width of the through hole and correspondingly the bridge structure filling the through hole usually at the narrowest portion thereof should not exceed 100 μm for a thin electrically insulating layer structure of not more than 200 μm thickness. An upper limit of 75 μm for the narrowest horizontal width of the through hole is even more preferred. It has been found that bridge formation may be disturbed during a plating procedure when the mentioned values are significantly exceeded.

Preferably, a narrowest diameter of the through hole is in a range between 55 μm and 70 μm. It has been surprisingly found that even in the presence of very thin cores, a narrowest width of the through hole in a range between 55 μm and 70 μm provides highly advantageous properties in terms of reliability. Firstly, the risk of the formation of undesired cracks in the electrically conductive filling of the through hole of a corresponding component carrier is very low, which ensures mechanical integrity and a reliable electrically conductive connection by the at least partially metal filled through hole. Secondly, the mentioned parameter selection strongly suppresses the formation of undesired voids in an interior of the filling medium which at least partially fills the through hole. This has also a positive impact on the reliability of transmitting electric signals and/or electric power by the copper filled laser via. Thirdly, such a copper filled via is also not prone to mechanical failure when significant temperature changes/thermal cycles impact the component carrier. Thus, a high electrical reliability, a high mechanical reliability and a high thermal reliability of the component carrier may be advantageously obtained by the mentioned combination of parameters.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as rein-forced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Teflon® is a registered mark of The Chemours Company FC, LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, at least one of the electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

The illustrations in the drawings are schematically presented. In different drawings, similar or identical elements are provided with the same reference signs.

Figure 4:
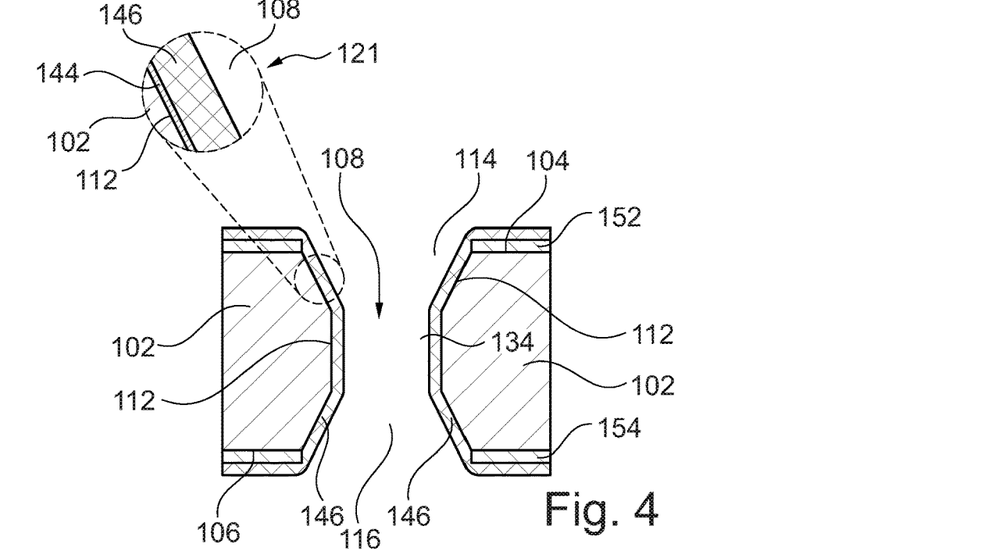
Figure 5:
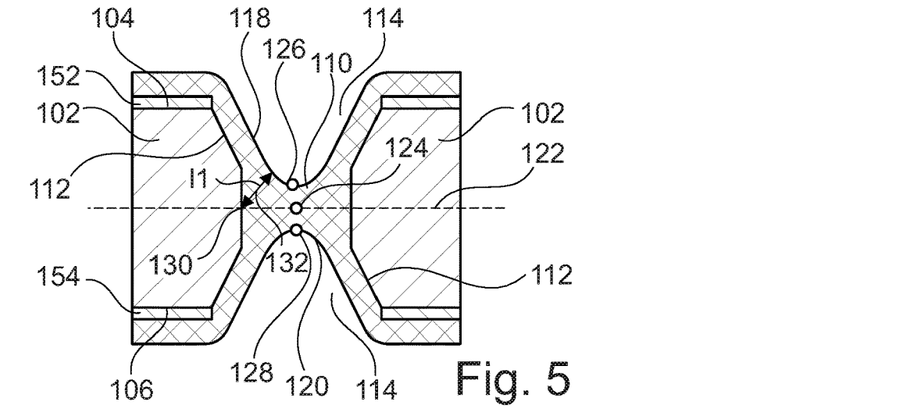
Figure 6:
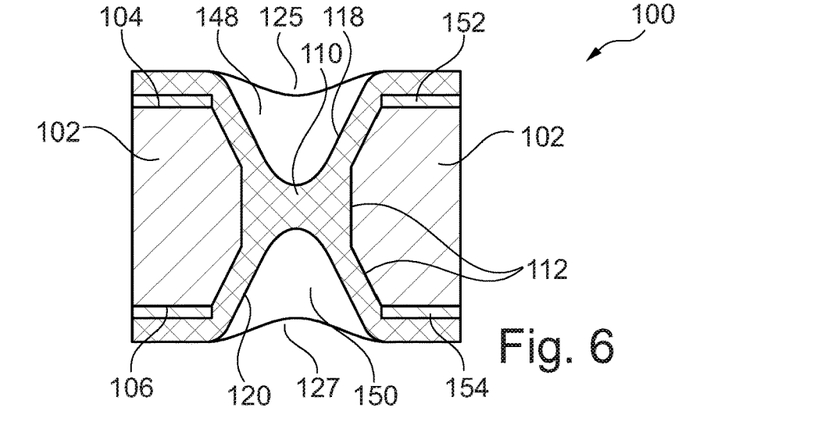

FIG. 1 to FIG. 6 illustrate cross-sectional views of structures obtained while manufacturing a component carrier 100, shown in FIG. 6, with a through hole 108 by a multiple laser shot treatment from opposing sides and by subsequently filling a through hole 108 with electrically conductive filling medium formed by multiple filling procedures according to an exemplary embodiment of the invention.

Figure 1:
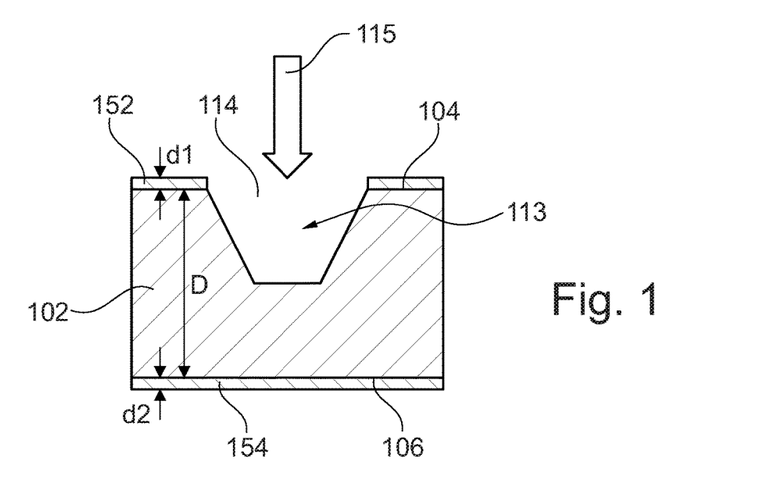
FIG. 1, FIG. 2, FIG. 3, FIG. 4, FIG. 5 and FIG. 6 illustrate cross-sectional views of structures obtained while performing example methods of manufacturing a component carrier with a through hole by a multiple laser shot treatment from opposing sides and by subsequently filling a through hole at least partially with electrically conductive filling medium according to an exemplary embodiment of the invention.

Referring to FIG. 1, a first part of the through hole 108 extending between a first main surface 104 and a second main surface 106 of an electrically insulating layer structure 102 is formed by carrying out a first laser shot 115. Laser processing as described referring to FIG. 1 to FIG. 3 may be carried out by an appropriate laser source, for instance by an excimer laser and/or a carbon dioxide laser. In the illustrated embodiment, the electrically insulating layer structure 102 may comprise resin (in particular epoxy resin), optionally comprising reinforcing particles such as glass fibers or glass spheres. A vertical thickness D of the electrically insulating layer structure 102 may for instance be not more than 100 µm, in particular in a range between 40 µm and 60 µm.

A blind hole 113 is formed by the first laser shot 115 in the upper main surface 104 of the electrically insulating layer structure 102. The blind hole 113 later constitutes a first tapering portion 114 of the through hole 108 completed according to FIG. 2 or FIG. 3. The first laser shot 115 also forms a window or through hole extending through a first electrically conductive layer structure 152, which may for instance be a metal layer such as a copper foil, on the first main surface 104 of the electrically insulating layer structure 102. The first electrically conductive layer structure 152 may have a thickness d1 of less than 5 µm, in particular in a range between 2 µm and 3 µm.

Care should be taken in terms of selection of laser energy and duration of the first laser shot 115 that the first laser shot 115 does not reach up to a second electrically conductive layer structure 154 on the second main surface 106 of the electrically insulating layer structure 102, because reflection of the laser light from the second electrically conductive layer structure 154 might result in an undesired shape of the formed through hole 108. The second electrically conductive layer structure 154 may for instance be a metal layer such as a copper foil and may have a thickness d2 of less than 5 µm, in particular in a range between 2 µm and 3 µm.

Figure 2:
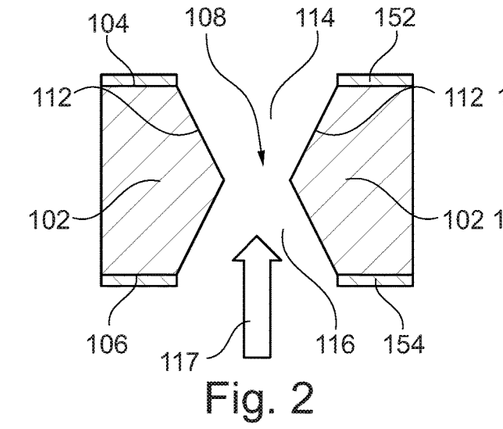

Referring to FIG. 2, the process of forming the through hole 108 is continued, after carrying out the first laser drilling from the first main surface 104 with one laser shot 115 as described referring to FIG. 1, by carrying out a second laser drilling from the second main surface 106 with one further laser shot 117, i.e. by altogether two laser shots 115, 117. Thereby, the illustrated through hole 108 is formed with a first tapering portion 114 extending from the first main surface 104 and resulting from the first laser shot 115, and with a second tapering portion 116 extending from the second main surface 106 and resulting from the second laser shot 117.

As can be taken from FIG. 2, the second laser shot 117 is carried out after the first laser shot 115 and from the back side, i.e. forming a through hole through the second electrically conductive layer structure 154 and extending the previously formed blind hole 113 into the through hole 108 extending through the entire thickness of the electrically insulating layer structure 102. After the first laser shot 115 and before the second laser shot 117, the structure shown in FIG. 1 may be flipped or turned around by 180° so that the laser source (not shown) may remain stationary.

In one embodiment, the obtained through hole 108 with a substantial X-shape as shown in FIG. 2 may be made subject to a procedure of filling the through hole 108 with electrically conductive material such as copper. Thus, the procedures illustrated and described below referring to FIG. 4 to FIG. 6 can also start on the basis of through hole 108 with substantial X-shape as shown in FIG. 2. Alternatively, it is possible to carry out a further laser shot 119 before filling the through hole 108 with electrically conductive material, as will be described referring to FIG. 3.

Figure 3:
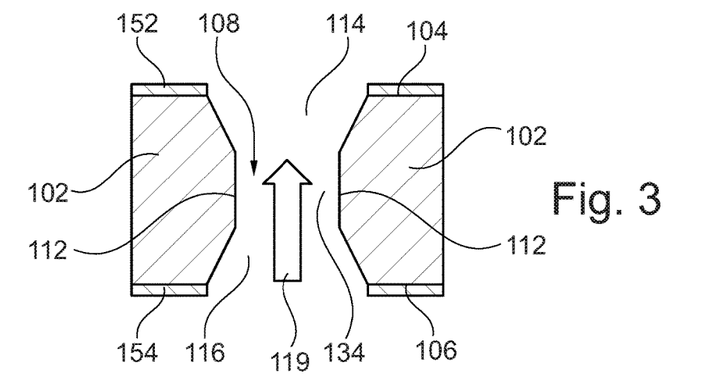

Referring to the alternative of FIG. 3, forming the through hole 108 comprises carrying out, in addition to the first laser drilling from the first main surface 104 with one laser shot 115 and in addition to the second laser drilling from the second main surface 106 with the second laser shot 117, a third laser drilling by a third laser shot 119 from the backside as well. FIG. 3 shows how a third laser shot 119 is carried out from the back side or from the second main surface 106 of the electrically insulating layer structure 102 following the procedure described referring to FIG. 2. By taking this measure, the shape of the through hole 108 can be further manipulated so that the narrowest portion of the through hole 108 is spatially widened and a for instance substantially circular cylindrical central connection portion 134 is formed between the tapering portions 114, 116.

In order to obtain the layer structure shown in FIG. 4, the through hole 108 according to FIG. 3 is made subject to a first procedure of filling it with an electrically conductive filling medium such as copper. In order to accomplish this, it is preferable to firstly carry out an electroless deposition procedure to thereby form a thin seed layer 144 of copper directly covering the sidewalls 112 of the electrically insulating layer structure 102 delimiting the through hole 108. This can be seen in a detail 121 in FIG. 4. A thickness of the seed layer 144 may be for instance 0.5 µm. However, it is also possible that the seed layer 144 has a thickness above 1 µm and/or that several cumulative seed layers are provided. For example, a thickness of a seed layer 144 or a cumulative thickness of a plurality of seed layers may be in a range between 0.5 µm and 5 µm. When multiple seed layers are provided, they may comprise an organic (for instance polymer) layer, a palladium layer, and/or a copper layer.

Subsequently, further electrically conductive material (such as copper) may be deposited on the seed layer 144 by a plating procedure, in particular by galvanic plating. Thus, the sidewalls 112 as well as the electrically conductive layer structures 152, 154 are covered by a thicker plating layer 146 of electrically conductive filling medium such as copper. For instance, the plating layer 146 may have a thickness of 10 µm.

Referring to FIG. 5, the plating procedure described referring to FIG. 4 is continued so as to form an electrically conductive bridge structure 110 with a substantially horizontal portion connecting opposing sidewalls 112 of the through hole 108. As shown, the electrically conductive bridge structure 110 is formed to be delimited by an upper first demarcation surface 118 oriented upwardly or facing towards the first main surface 104 and by a lower second demarcation surface 120 orientated downwardly or facing towards the second main surface 106. Forming the electrically conductive bridge structure 110 may be carried out by galvanic plating, preferably following the formation of the seed layer 144 described referring to FIG. 4. Thus, the bridge structure 110 is composed of seed layer 144 being covered with plating layer 146 and forms a substantially horizontal bridge between opposing sidewalls 112 of the electrically insulating layer structure 102 delimiting the through hole 108.

A virtual central bridge plane 122 is defined to extend parallel to the first main surface 104 and parallel to the second main surface 106 and at a height corresponding to a vertical center 124 or midpoint between a lowermost point 126 of the first demarcation surface 118 and an uppermost point 128 of the second demarcation surface 120. Moreover, a virtual first intersection point 130 is defined as a first intersection between the central bridge plane 122 and one of the sidewalls 112 of the electrically insulating layer structure 102. According to a highly advantageous design rule resulting in a highly reliable component carrier 100, the electrically conductive bridge structure 110 is formed so that a length l1 of a shortest distance or first perpendicular 132 from the first intersection point 130 to the first demarcation surface 118 is at least 8 µm, preferably at least 15 µm.

Thus, FIG. 5 shows a layer structure obtained when continuing the plating procedure described referring to FIG. 4. In the region of the narrowest portion of the through hole 108, the substantially horizontal bridge structure 110 is formed connecting the opposing sidewalls 112. A concave upper limiting surface corresponds to the first demarcation surface 118, whereas a lower concave limiting surface of the bridge structure 110 corresponds to the second demarcation surface 120. At a vertically intermediate position between the bottom end of the first demarcation surface 118 and a top end of the second demarcation surface 120, the central bridge plane 122 is obtained as a virtual plane being parallel to the first main surface 104 and the second main surface 106 so that all three of the mentioned planes extend horizontally according to the paper plane of FIG. 5, i.e. perpendicular to a stacking direction of the layer structures 102, 152, 154 of the component carrier 100 to be manufactured.

A circumferential intersection line is formed when intersecting the virtual central bridge plane 122 with the three-dimensional area defining the sidewall 112 delimiting the through hole 108. One intersection point between the central bridge plane 122 and the sidewalls 112 is denoted with reference numeral 130 in FIG. 5. When virtually connecting intersection point 130 with first demarcation surface 118 so that the corresponding connection line, see the perpendicular 132, is perpendicular to a tangent (in particular tangent plane) of the curved first demarcation surface 118, a design parameter l1 is obtained. As will be described below in further detail referring to FIG. 7 and FIG. 8, the minimum distance l1 should be at least 8 µm, preferably at least 15 µm to obtain very good reliability results of the readily manufactured component carrier 100.

Although not shown in FIG. 5, the geometry of the through hole 108 may result, when carrying out a plating process, in the formation of bridge structure 110 laterally connecting opposing sidewalls 112 of the electrically insulating layer structure 102 delimiting the through hole 108 at a vertical level at which the distance to the first main surface 104 is different from the distance to the second main surface 106. This may promote the formation of a free hanging, asymmetrical bridge structure 110 located out of a vertical center of the through hole 108.

Referring to FIG. 6, a first electrically conductive bulk structure 148 filling a major part between the first demarcation surface 118 and the first main surface 104 and a second electrically conductive bulk structure 150 filling a major part between the second demarcation surface 120 and the second main surface 106 are formed. This can be done by carrying out one or more further galvanic plating procedures following the previous plating procedure of forming the bridge structure 110.

Thus, the component carrier 100 according to FIG. 6 can be obtained by carrying out one or more further plating procedures. Thereby, the bulk structures 148, 150, which may for instance consist of copper, can be obtained. In the shown embodiment, a small dip 125, 127, respectively, remains at an upper side or a lower side of the shown component carrier 100. In other embodiments, the bulk structures 148, 150 fill the remaining recesses above the first demarcation surface 118 and below the second demarcation surface 120 almost completely. It should be said that it is well-known by a skilled person that the demarcation surfaces 118, 120 are clearly visible when imaging a cross-section of the component carrier 100.

Figure 7:
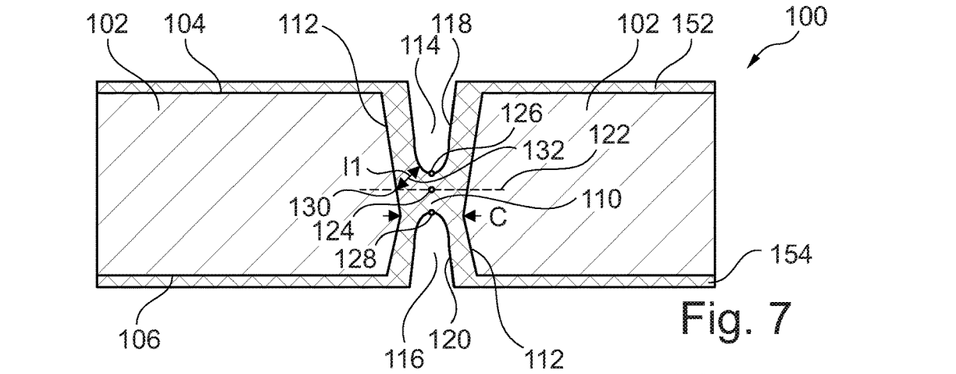
FIG. 7 illustrates a schematic cross-sectional view of a component carrier with through hole according to an exemplary embodiment of the invention.
Figure 8:
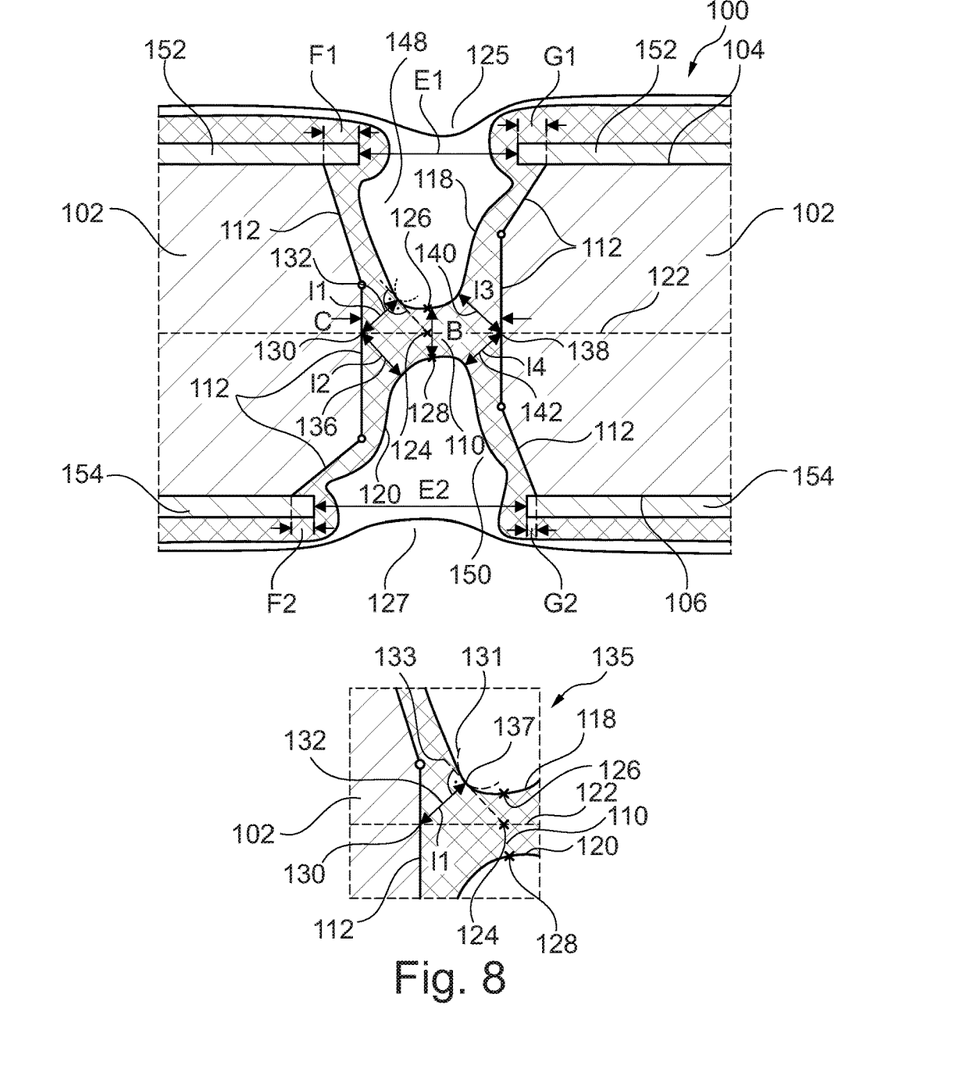
FIG. 8 illustrates an example of a realistic cross-sectional view of a component carrier with through hole according to an exemplary embodiment of the invention.

FIG. 7 illustrates a schematic cross-sectional view of a component carrier 100 with through hole 108 according to an exemplary embodiment of the invention. According to FIG. 7, the through hole 108 is substantially X-shaped. For instance, such a substantial X-shape may be defined, referring to a cross-sectional view of the component carrier 100 or its preform, by sidewall lines corresponding to two opposing vertical bows having their maxima facing each other in a central portion of the through hole 108. The shape of the through hole 108 may hence also be denoted as the shape of a vertical bow tie or of a mirrored truncated cone structure. FIG. 8 illustrates a realistic cross-sectional view of a component carrier 100 with a through hole 108 according to an exemplary embodiment of the invention. According to FIG. 8, two opposing exterior portions of the through hole 108 are tapering, whereas a central portion of the through hole is substantially cylindrical.

In the illustrated embodiments, the example component carriers 100 can be laminate-type plate-shaped component carriers 100 such as a printed circuit board (PCB). The component carriers 100 may comprise a layer stack composed of the central electrically insulating layer structure 102 being covered on each of its opposing main surfaces 104, 106 by a respective one of the two electrically conductive layer structures 152, 154. Preferably, the electrically insulating layer structure 102 is made of a fully cured material such as FR4. The electrically conductive layer structures 152, 154 may be patterned copper foils.

The through hole 108 extending through the electrically insulating layer structure 102 between the first main surface 104 and the second main surface 106 is filled in a central portion thereof with electrically conductive filling medium such as copper. This electrically conductive filling medium comprises the electrically conductive bridge structure 110 connecting opposing sidewalls 112 of the through hole 108. In the configuration of FIG. 8, the through hole 108 comprises a central connection portion 134 connecting the first tapering portion 114 with the second tapering portion 116, and the horizontal section of the bridge structure 110 is located in the central connection portion 134 (concerning the reference numerals, compare FIG. 3). In the configuration of FIG. 7, the horizontal section of the bridge structure 110 is located around a narrowest portion of the substantially X-shaped through hole 108. Apart from its substantially horizontal section, the bridge structure 110 also covers the sidewalls 112 and there-fore has a substantial H shape, both in FIG. 7 and in FIG. 8.

As mentioned above, the electrically conductive bridge structure 110 is delimited at an upper side by first demarcation surface 118 facing towards the first main surface 104 and at a lower side by second demarcation surface 120 facing towards the second main surface 106. The virtual central bridge plane 122 is defined to extend parallel to the first main surface 104 and the second main surface 106 and at a vertical center 124 between a lowermost point 126 of the first demarcation surface 118 and an uppermost point 128 of the second demarcation surface 120. A vertical distance between the lowermost point 126 and the vertical center 124 equals to a vertical distance between the uppermost point 128 and the vertical center 124. A virtual first intersection point 130 is defined as a first intersection between the central bridge plane 122 and the sidewall 112 of the electrically insulating layer structure 102 on the left-hand side of FIG. 7 and FIG. 8.

Advantageously, a length l1 of a shortest distance or a first perpendicular 132 from the first intersection point 130 to the first demarcation surface 118 is at least 8 µm, preferably at least 15 µm, and most preferably the length l1 is in the range between 20 µm and 30 µm, to obtain very good results in terms of electric reliability of the component carrier 100. Correspondingly, a length l2 of a shortest distance or a second perpendicular 136 from the first intersection point 130 to the second demarcation surface 120 is at least 8 µm, preferably at least 15 µm, and most preferably between 20 µm and 30 µm.

Accordingly, a virtual second intersection point 138 is defined as a second intersection between the central bridge plane 122 and the sidewalls 112 of the electrically insulating layer structure 102 on the right-hand side of FIG. 8. A length l3 of a shortest distance or a third perpendicular 140 from the second intersection point 138 to the first demarcation surface 118 is at least 8 µm, preferably at least 15 µm, and most preferably between 20 µm and 30 µm. Correspondingly, a length l4 of a shortest distance or a fourth perpendicular 142 from the second intersection point 138 to the second demarcation surface 120 is at least 8 µm, preferably at least 15 µm, and most preferably between 20 µm and 30 µm.

In the virtual central bridge plane 122 perpendicular to the paper plane of FIG. 7 and FIG. 8, a virtual circumferential intersection line (not shown) is defined by connecting all intersection points (130, 138, etc.) corresponding to an intersection between the central bridge plane 122 and circumferential sidewalls 112 of the electrically insulating layer structure 102. Particularly satisfying results in terms of electric reliability of the component carrier 100 can be obtained when a length of all shortest distances or perpendiculars from the circumferential intersection line to the first demarcation surface 118 is at least 8 µm, preferably at least 15 µm, and most preferably between 20 µm and 30 µm. Correspondingly, a length of all shortest distances or all perpendiculars from the circumferential intersection line to the second demarcation surface 120 may be at least 8 µm, preferably at least 15 µm, and most preferably between 20 µm and 30 µm, to obtain particularly pronounced advantages in terms of reliability.

As mentioned above, thickness D of the electrically insulating layer structure 102 is preferably less than 100 µm, so that the electrically insulating layer structure 102 forms a very thin fully cured core.

First electrically conductive bulk structure 148 fills a major part between the first demarcation surface 118 and the first main surface 104. Second electrically conductive bulk structure 150 fills a major part between the second demarcation surface 120 and the second main surface 106, wherein small dips 125, 127 may remain. Both the first electrically conductive bulk structure 148 and the second electrically conductive bulk structure 150 may be formed by carrying out one or multiple galvanic plating procedures which may be carried out after and separately from a plating procedure for the formation of the bridge structure 110.

A detail 135 in FIG. 8 illustrates exemplarily how the first perpendicular 132 may be constructed in order to define the described design rule in terms of improved reliability of the component carrier 100. The shortest connection between intersection point 130 and the first demarcation surface 118 is searched and is found by a connection line between intersection point 130 and first demarcation surface 118 which is perpendicular (see right angle in detail 135) to first demarcation surface 118. In other words, a tangent 133 to the first demarcation surface 118 (see auxiliary circle 131 at the intersection point 137) can thus be constructed. The design rule is fulfilled when the length 11 is larger than 8 μm.

In order to obtain proper reliability of the component carrier 100 shown in FIG. 8, one or more of the following design rules may be fulfilled as well: A smallest vertical thickness B of the bridge structure 110 may be at least 20 μm. A smallest horizontal distance C between opposing sidewalls 112 may be in a range between 55 μm and 70 μm. A horizontal dimension E1 of the window in the first electrically conductive layer structure 152 may be in the range between 65 μm and 80 μm. Correspondingly, a horizontal dimension E2 of the window in the second electrically conductive layer structure 154 may be in the range between 65 μm and 80 μm as well. The lateral overhang F1 between the first electrically conductive layer structure 152 and the sidewall 112 on the left-hand side of FIG. 8 may be in the range between 10 μm and 15 μm. The lateral overhang G1 between the first electrically conductive layer structure 152 and the sidewall 112 on the right-hand side of FIG. 8 may be in the range between 10 μm and 15 μm. The lateral overhang F2 between the second electrically conductive layer structure 154 and the sidewall 112 on the left-hand side of FIG. 8 may be in the range between 10 μm and 15 μm. The lateral overhang G2 between the second electrically conductive layer structure 154 and the sidewall 112 on the right-hand side of FIG. 8 may be in the range between 10 μm and 15 μm. Furthermore, when the condition F1≠F2 and/or G1≠G2 is fulfilled, particularly good results can be obtained in terms of reliability. Moreover, it has turned out advantageous for obtaining good reliability when a lateral offset between a center of the window in the first electrically conductive layer structure 152 and a window in the second electrically conductive layer structure 154 is not larger than 20 μm.

What concerns the above described overhangs F1, F2, G1, G2 of overhanging material which may be locally not supported, it should be said that the respective overhang may relate to the substantially resin free area beneath the respective electrically conductive layer structure 152, 154. However, a person skilled in the art will understand that some residue resin might be even present within a gap relating to the overhang. In order to quantitatively determine or measure the value of the overhang, the length of the substantially resin-free (wherein resin may refer to the electrically insulating layer structure 102) undercut directly under an overhanging electrically conductive layer structure 152, 154 may be measured (in particular even if it is not the most receding point or total relief below the overhanging electrically conductive layer structure 152, 154, for example copper layer). In other words, for measuring the overhang, the undercut directly below the electrically conductive layer structure 102 may be measured.

Figure 9:
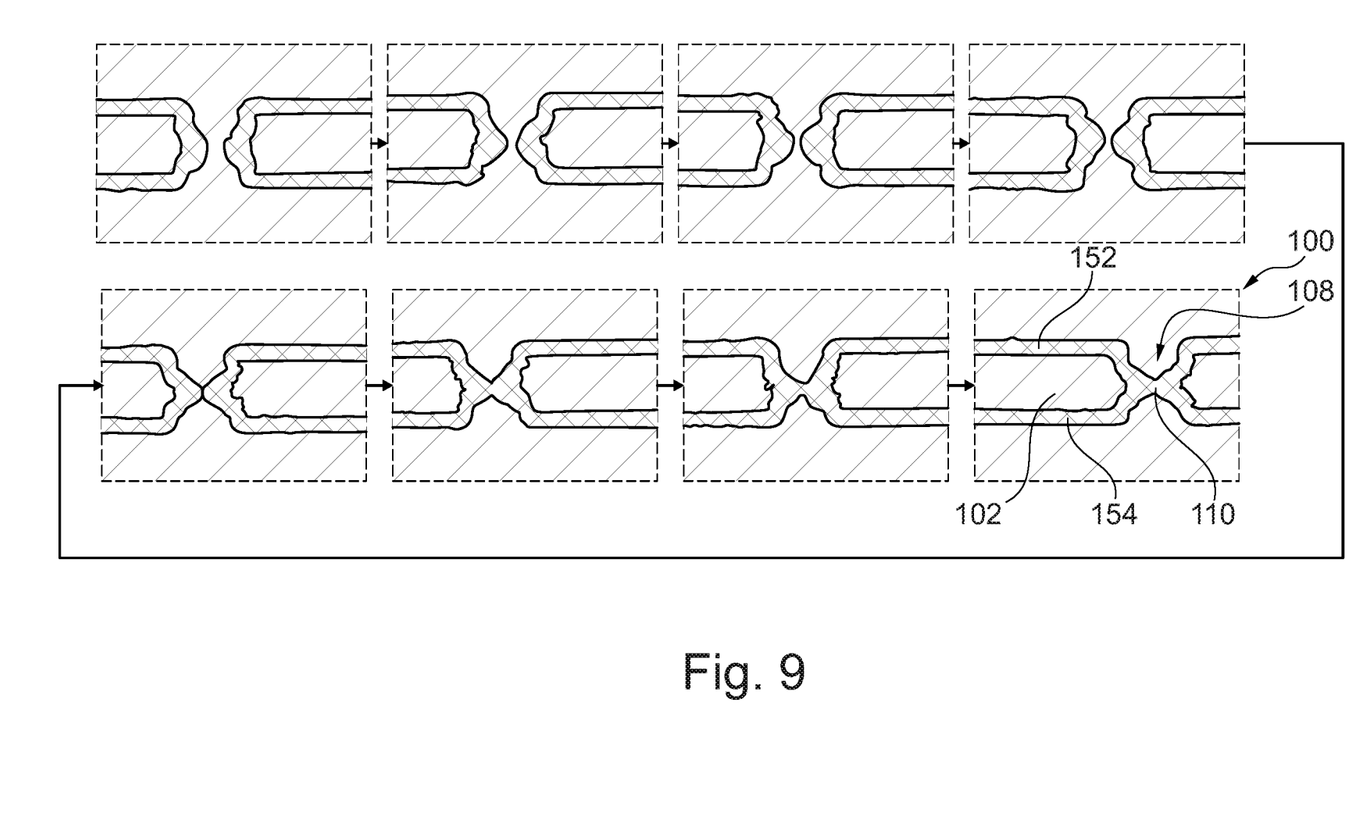
FIG. 9 illustrates cross-sectional views of preforms of a component carrier manufactured in accordance with a manufacturing method according to an exemplary embodiment of the invention.

FIG. 9 illustrates cross-sectional views of preforms of a component carrier 100 manufactured in accordance with a manufacturing method according to an exemplary embodiment of the invention. More specifically, FIG. 9 illustrates a sequence of cross-sections of a presently manufactured component carrier 100 showing the successive formation of a bridge structure 110 meeting design rules according to exemplary embodiments of the invention.

Figure 2A:
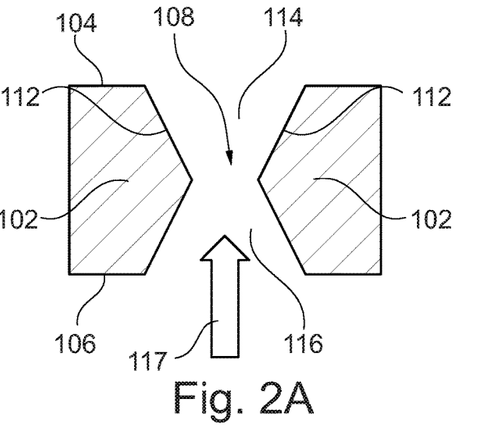
FIG. 2A shows a cross-sectional view of a preform of a component carrier according to another exemplary embodiment relating to FIG. 2 but with the difference that no electrically conductive layer structures are provided on the opposing main surfaces of the electrically insulating layer structure at the time of forming the through hole.

FIG. 2A shows a cross-sectional view of a preform of a component carrier 100 according to another exemplary embodiment relating to FIG. 2 but with the difference that no electrically conductive layer structures 152, 154 are provided on the opposing main surfaces 104, 106 of the electrically insulating layer structure 102 at the time of forming the through hole 108.

A main difference between the embodiment of FIG. 1 to FIG. 6 and the embodiment of FIG. 2A is that, according to FIG. 2A, the main surfaces 104, 106 of the electrically insulating layer structure 102 have not been covered by electrically conductive layer structures 152, 154 at the time of forming the through hole 108. Thus, the manufacturing method relating to the embodiment of FIG. 2A comprises forming the through hole 108 in the electrically insulating layer structure 102 while the main surfaces 104, 106 of the electrically insulating layer structure 102 have not been covered by an electrically conductive layer structure 152, 154 such as a copper foil.

What concerns the subsequent filling of the through hole 108 and coverage of the main surfaces 104, 106 with an electrically conductive filling medium, this may be carried out by the formation of an optional seed layer 144, the subsequent optional formation of a plating layer (not shown) covering at least part of the main surfaces 104, 106 and of the sidewalls 112 of the through hole 108, the subsequent formation of a bridge structure 110 bridging opposing sidewalls 112 and having for instance a substantially H-shape, and an optional filling of one or both volumes above and/or below the bridge structure 110 by one or more bulk structures 148, 150 (which may be further plating structures or sequences of plating structures). Reference is made to the corresponding description of FIG. 4 to FIG. 8.

Apart from this difference, the above disclosure concerning FIG. 1 to FIG. 6 also applies to FIG. 2A. Also, through hole formation according to FIG. 3 can be carried out without copper foils on the electrically insulating layer structure 102.

It should be noted that the term "comprising" does not exclude other elements or steps and the articles "a" or "an" do not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
   an electrically insulating layer structure having a first main surface and a second main surface;
   a through hole extending through the electrically insulating layer structure between the first main surface and the second main surface; and
   an electrically conductive bridge structure connecting opposing sidewalls delimiting the through hole;
   wherein the through hole has a first tapering portion extending from the first main surface and a second tapering portion extending from the second main surface;
   wherein the electrically conductive bridge structure is delimited by a first demarcation surface facing towards the first main surface and by a second demarcation surface facing towards the second main surface and wherein the electrically conductive bridge structure only partially fills the through hole;
   wherein a central bridge plane is defined to extend parallel to the first main surface and the second main surface and at a vertical center between a lowermost point of the first demarcation surface and an uppermost point of the second demarcation surface;
wherein a first intersection point is defined as a first intersection between the central bridge plane and one of the sidewalls delimiting the through hole;
wherein a length of a shortest distance from the first intersection point to the first demarcation surface is at least 8 µm;
wherein at least a part of the through hole has a central substantially cylindrical section between the first tapering portion and the second tapering portion,
wherein at least one of the central bridge plane and of the first intersection point is located at the central substantially cylindrical section of the through hole,
further comprising an electrically conductive layer structure on one of the first main surface and the second main surface of the electrically insulating layer structure, the electrically conductive layer structure with a lateral overhang extending into the through hole such that the bridge structure contacts opposed surfaces of the lateral overhang.

2. The component carrier according to claim 1, wherein a length of a shortest distance from the first intersection point to the second demarcation surface is at least 8 µm.

3. The component carrier according to claim 1, wherein a second intersection point is defined as a second intersection between the central bridge plane and another one of the sidewalk delimiting the through hole,
wherein a length of a shortest distance from the second intersection point to the first demarcation surface is at least 8 µm.

4. The component carrier according to claim 3, wherein a length of a shortest distance from the second intersection point to the second demarcation surface is at least 8 µm.

5. The component carrier according to claim 1, wherein a circumferential intersection line is defined by connecting all intersection points corresponding to an intersection between the central bridge plane and circumferential sidewalk delimiting the through hole;
wherein a length of all shortest distances from the circumferential intersection line to the first demarcation surface is at least 8 µm.

6. The component carrier according to claim 5, wherein a length of all shortest distances from the circumferential intersection line to the second demarcation surface is at least 8 µm.

7. The component carrier according to claim 1, comprising at least one of the following features:
a thickness of the electrically insulating layer structure is less than 100 µm;
the electrically insulating layer structure is a core;
the bridge structure also covers at least part of the sidewalls;
the bridge structure is composed of a seed layer being covered with a plating layer.

8. The component carrier according to claim 1, further comprising:
a first electrically conductive bulk structure filling at least part of a volume between the first demarcation surface and the first main surface; and/or
a second electrically conductive bulk structure filling at least part of a volume between the second demarcation surface and the second main surface,
wherein at least one of the first demarcation surface and of the second demarcation surface is irregular on opposed sides of a line defined by a lower most point of the first demarcation surface and the uppermost point of the second demarcation surface, or
wherein the bridge structure is asymmetrical about the central bridge plane.

9. The component carrier according to claim 8, wherein at least one of the first electrically conductive bulk structure and the second electrically conductive bulk structure is a plating structure.

10. The component carrier according to claim 1, wherein at least one of a first electrically conductive layer structure on the first main surface and a second electrically conductive layer structure on the second main surface is a patterned electrically conductive layer structure.

11. The component carrier according to claim 1, further comprising at least one of the following features:
at least one of the first demarcation surface and the second demarcation surface has a concave shape;
a cross-section of the bridge structure is substantially H-shaped;
a narrowest vertical thickness of the bridge structure is at least 20 µm;
a narrowest horizontal width of the through hole is not more than 100 µm;
a narrowest horizontal width of the through hole is not less than 30 µm;
a narrowest diameter of the through hole is in a range between 55 µm and 70 µm.

12. The component carrier according to claim 1, further comprising at least one of the following features:
at least one component embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
at least one electrically conductive layer structure of the component carrier includes at least one element of a group of elements consisting of copper, aluminum, nickel, silver, gold, palladium, and tungsten;
the electrically insulating layer structure comprises at least one of a group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
the component carrier is shaped as a plate;
the component carrier is configured as one of a group consisting of a printed circuit board, and a substrate;
the component carrier is configured as a laminate-type component carrier.

13. A method of manufacturing a component carrier, the method comprising:
forming a through hole extending between a first main surface and a second main surface of an electrically insulating layer structure, wherein the through hole is formed with a first tapering portion extending from the first main surface, a second tapering portion extending from the second main surface and a central substantially cylindrical section between the first tapering portion and the second tapering portion; and forming an electrically conductive bridge structure connecting opposing sidewalls delimiting the through hole, wherein the electrically conductive bridge structure is formed to be delimited by a first demarcation surface facing towards the first main surface and by a second demarcation surface facing towards the second main surface, wherein the electrically conductive bridge structure only partially fills the through hole;

wherein a central bridge plane is defined to extend parallel to the first main surface and the second main surface and at a vertical center between a lowermost point of the first demarcation surface and an uppermost point of the second demarcation surface;

wherein a first intersection point is defined as a first intersection between the central bridge plane and one of the sidewalls delimiting the through hole;

wherein the electrically conductive bridge structure is formed so that a length of a shortest distance from the first intersection point to the first demarcation surface is at least 8 µm, wherein at least one of the central bridge plane and of the first intersection point is located at the central substantially cylindrical section of the through hole, the method further comprising forming an electrically conductive layer structure on one of the first main surface and the second main surface of the electrically insulating layer structure, the electrically conductive layer structure with a lateral overhang extending into the through hole such that the bridge structure contacts opposed surfaces of the lateral overhang.

14. The method according to claim 13, wherein forming the electrically conductive bridge structure is carried out by plating following a seed layer formation.

15. The method according to claim 13, further comprising:
forming a first electrically conductive bulk structure filling at least part of a volume above the first demarcation surface; and/or
forming a second electrically conductive bulk structure filling at least part of a volume below the second demarcation surface.

16. The method according to claim 15, wherein forming at least one of the group consisting of the first electrically conductive bulk structure and the second electrically conductive bulk structure by at least one further plating procedure following a previous plating procedure of forming the bridge structure.

17. The method according to claim 13, further comprising:
before forming the through hole:
providing a first electrically conductive layer structure on the first main surface;
and/or
providing a second electrically conductive layer structure on the second main surface.

18. The method according to claim 13, wherein forming the through hole is performed while at least one of the main surfaces of the electrically insulating layer structure is covered by an electrically conductive layer structure.

19. The method according to claim 13, wherein forming the through hole comprises a first drilling with a laser from the first main surface with one laser shot and a second drilling with a laser from the second main surface with two laser shots.

* * * * *